United States Patent [19]
Tonucci et al.

[11] Patent Number: 5,332,681
[45] Date of Patent: Jul. 26, 1994

[54] METHOD OF MAKING A SEMICONDUCTOR DEVICE BY FORMING A NANOCHANNEL MASK

[75] Inventors: Ronald J. Tonucci, Temple Hills, Md.; Brian L. Justus, Springfield, Va.

[73] Assignee: The United States of America as represented by the Secretary of the Navy, Washington, D.C.

[21] Appl. No.: 897,630

[22] Filed: Jun. 12, 1992

[51] Int. Cl.$^5$ .................................. H01L 21/263
[52] U.S. Cl. .................................. 437/16; 437/107; 148/DIG. 106
[58] Field of Search .............. 437/16, 36, 80, 107, 437/948, 962; 148/DIG. 104, DIG. 106, DIG. 143; 118/720

[56] References Cited

U.S. PATENT DOCUMENTS

| | | | |
|---|---|---|---|
| 3,383,251 | 5/1968 | Scott | 437/80 |
| 3,535,775 | 10/1970 | Garfinkel et al. | 148/DIG. 106 |
| 4,101,303 | 7/1978 | Balkwill | 65/31 |
| 4,397,078 | 8/1983 | Imahashi | 437/80 |
| 4,503,447 | 3/1985 | Iafrate et al. | 437/107 |
| 4,812,418 | 3/1989 | Pfiester et al. | 437/72 |
| 4,912,531 | 3/1990 | Reef et al. | 257/17 |
| 5,059,001 | 10/1991 | Shimizu | 257/21 |
| 5,135,609 | 8/1992 | Pease et al. | 156/659.1 |

*Primary Examiner*—Brian E. Hearn
*Assistant Examiner*—C. Chaudhari
*Attorney, Agent, or Firm*—Thomas E. McDonnell; George A. Kap

[57] ABSTRACT

The present invention provides a method for depositing a pattern of deposited material on or within a substrate, comprising the steps of: interposing a glass mask between a source and a substrate, the mask having channels therethrough which are arranged in a pattern and which have an average diameter of less than 1 micron; and depositing a material selected from the group of sources consisting of ions, electrons, photons, metals and semiconductor materials through the glass mask into or onto the substrate. The present invention also provides semiconductor devices made by this method.

6 Claims, 12 Drawing Sheets

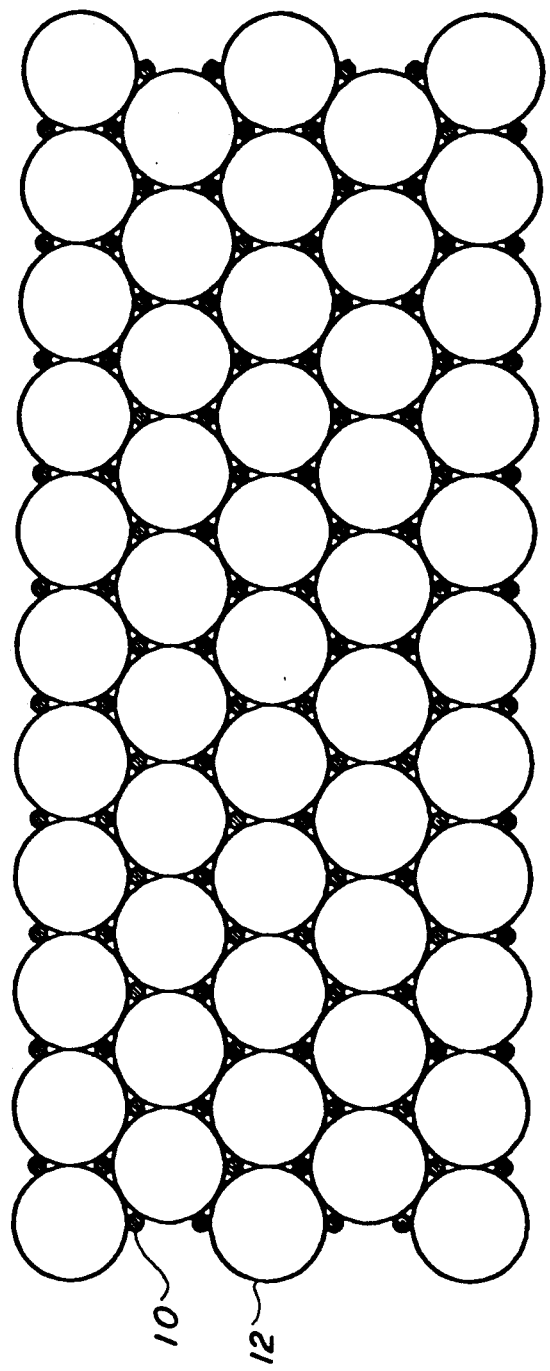

METHOD OF MAKING A SEMICONDUCTOR DEVICE BY FORMING A NANOCHANNEL MASK

BACKGROUND OF THE INVENTION

1. Field of the Invention

The present invention relates to semiconductor lithography.

2. Prior art

Considerable effort over the past two decades has been expended to develop techniques to fabricate materials with ultrasmall dimensions, usually embedded in a protective or interactive matrix. The constraints on size are highly dependent upon the specific application, however the ultimate goal is to produce materials that can be engineered from macroscopic dimensions to atomic proportions in size. Attempts at small device fabrication of solid materials have taken two general approaches. The first utilizes a macroscopic deposition of materials followed by removal of excess material on a microscopic scale, and the second involves a variety of specialized growth techniques, such as molecular beam epitaxy and metallo-organic chemical vapor deposition (MOCVD), where the "device" is incorporated into the structure during the growth process. Although great progress has been made, a host of problems still need to be resolved. There is no good way to manufacture highly uniform and symmetric arrays containing greater than $10^3$ elements of quantum confined materials. Further, if the elements are quantum confined optical devices, they have the additional constraint that their performance is especially susceptible to material damage.

The semiconductor industry relies on a variety of lithographic mask types to define regions where deposition, or lack of deposition, of dissimilar materials will occur. Electron and ion beam direct writing on energy sensitive surfaces have been developed to produce a mask capable of defining structures as small as 10 nm. To obtain high resolution, the beams are tightly focused which requires a large acceleration of the charged particles composing the beam. After the particles pass through the lithographic medium defining a pattern, they pass into the substrate and stop, where they deposit their remaining kinetic energy. The interaction of the particles with the substrate usually causes damage to the substrate, which in most cases is detrimental to small device fabrication. In addition, scattering of the particles in the substrate back into the lithographic material usually reduces the sharpness and contrast of the mask, lowering the mask resolution.

Another type of lithographic mask involves photoresistive material. Photons pass through the transparent portions of an otherwise opaque mask and reproduce the pattern on photoresistive material, forming a resist mask. Resolution of the pattern on the resist is ultimately limited by the wavelength of the photons used to form it (i.e. minimum resolution > wavelength/2). A pattern with structures 10 nm in width and a 50% variation in definition would require photons with wavelength less than 10 nm, a demanding region of the spectrum in which to work.

Once the resist mask is fabricated, it is possible to add or remove materials defined by the mask. Addition of materials such as metals generally preserves the resolution of the mask. However, removal of substrate materials below the mask requires techniques such as reactive ion etching (RIE), chemical etching, etc. These processes usually distort the image of the mask as the etching process continues deeper into the substrate. In addition, the interaction of the RIE particles with the substrate usually causes damage to the substrate, which in most cases is detrimental to small device fabrication.

A third type of mask is one where deposition of desired material is physically blocked or passed in regions by prefabricated mask laid down on the substrate. To date the smallest structures within these masks are on the order of 10's of microns in size.

Devices that utilize tunneling of electrons or elementary excitations such as excitons, are very sensitive to barrier heights and widths. Arrays of devices that require identical barriers (i.e. identical device characteristics) then become extremely sensitive to the overall composition of the array in the elements within the array. Variations of less than 10 percent in size or position of the quantum confined array element are sufficient to wash out the optical signature of both cooperative effects and energy shifts due to confinement.

Recent attempts at defining quantum confined arrays of wires or dots have relied on a variety of masking, etching and growth techniques. Due to the small size requirements for quantum confinement (often <50 nm), these processes usually contaminate the quantum material by damage or extraneous material deposition, which is generally detrimental to device performance. Where material damage is intentionally invoked to define the structure of the device, component boundaries tend to be vague, compromising large scale geometries. Arrays fabricated by controlled growth techniques over substrates tend to be extremely labor and time intensive, and exhibit good uniformity over a relatively small region of the array. Chemical etching of free standing arrays utilizing masking techniques tend to be fragile and curve definition is extremely process and material dependent.

SUMMARY OF THE INVENTION

The present invention provides a method for depositing a pattern of deposited material on or within a substrate, comprising the steps of:

interposing a glass mask between a source and a substrate with or without a resist, the mask having empty channels therethrough which are arranged in a pattern and which have an average diameter of less than 1 micron; and depositing a material selected from the group of sources consisting of ions, electrons, photons, metals and semiconductor materials through the glass mask into or onto the substrate with or without a resist.

In another embodiment the present invention provides a method for forming a semiconductor device, comprising the steps of:

growing a first layer of first semiconductor material over a second semiconductor material substrate to form a base;

interposing a glass mask between the base and a source of the first semiconductor material;

depositing additional first semiconductor material through the glass mask and onto the base to form an array of pedestals;

removing the mask;

depositing a second layer of the second semiconductor material to form a cap on top of each pedestal and to form a connected layer of the second semiconductor material completely covering the base; and depositing a layer of the first semiconductor material over the second layer of the second semiconductor material to form an array of quantum dots suspended over a quantum well structure having holes therein.

In another embodiment the present invention provides a method for forming a semiconductor device comprising the steps of:

interposing a glass mask between a semiconductor material substrate and a source of molten metal dopant, the mask having channels therethrough which are arranged in a pattern and which have an average diameter of less than 1 micron;

depositing the metal dopant through the mask and onto the substrate of semiconductor material;

removing the mask;

ion implanting additional metal dopant into the substrate;

removing metal dopant on the surface of the substrate; and annealing the doped substrate to form a semiconductor device.

In another embodiment, the present invention provides a method of forming a semiconductor device comprising the steps of:

forming a glass block of an acid inert glass having acid etchable glass rods extending therethrough, the acid etchable glass rods having a diameter of less than 1 micron, the acid inert glass having a lower melting point than the acid etchable glass;

partially etching the acid etchable rods so that an exposed surface of the acid inert glass block extends above the ends of the acid etchable rods;

bonding the exposed ends of the acid etchable rods to a substrate;

etching away the acid etchable rods from the acid inert glass to form a mask on the substrate; and depositing a coating selected from the group consisting of metals and semiconductor materials through the mask onto the substrate to form a semiconductor device or ion implantation mask.

The present invention also provides semiconductor devices made by the above methods.

BRIEF DESCRIPTION OF DRAWINGS

FIG. 6(d) is an alternate embodiment showing the use if solid rods of different sizes wherein the rods are either inert or acid-etchable.

DETAILED DESCRIPTION OF THE INVENTION

The nanochannel mask of the present invention is a patterned arrangement of sub-micron sized holes or channels in a glass matrix. It is used where the deposition of desired materials (ions, electrons, photons, etc.) is physically blocked or passed in regions by overlaying the mask on a chemically active or energy sensitive surface above the substrate, or on a substrate directly. A multitude of complex configurations are possible. The fabrication process involves an arrangement of dissimilar glasses of which at least one glass is acid etchable.

In one embodiment of the invention, the mask is formed as a uniform array of equally spaced rods of acid etchable glass in a hexagonal 2-dimensional close packing arrangement. The hexagonal close packing arrangement of hexagonal glass fibers, with acid etchable channels of greater than 1 micron is a well known technology and is frequently used in the first processing step of microchannel plates.

Figure 2:
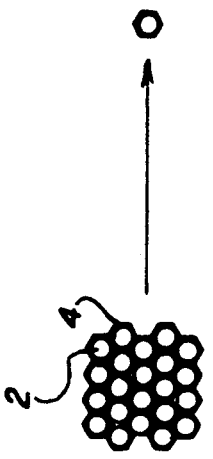
FIG. 2 illustrates stacked rods which have been redrawn several times.
Figure 3:
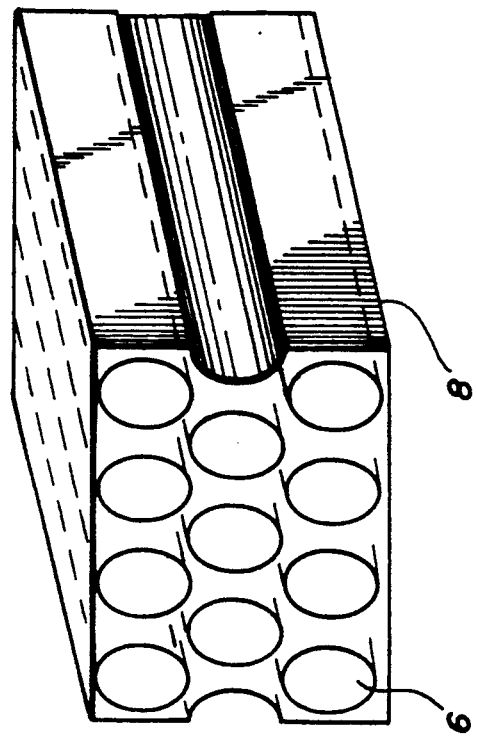
FIG. 3 is a right perspective view of a mask of the invention.
Figure 1:
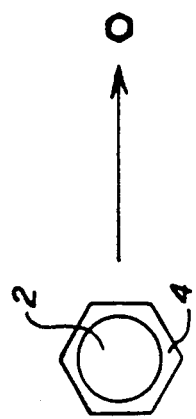
FIG. 1 illustrates the reduction in size of an acid etchable rod inside a hollow inert glass rod.
Figure 4A:
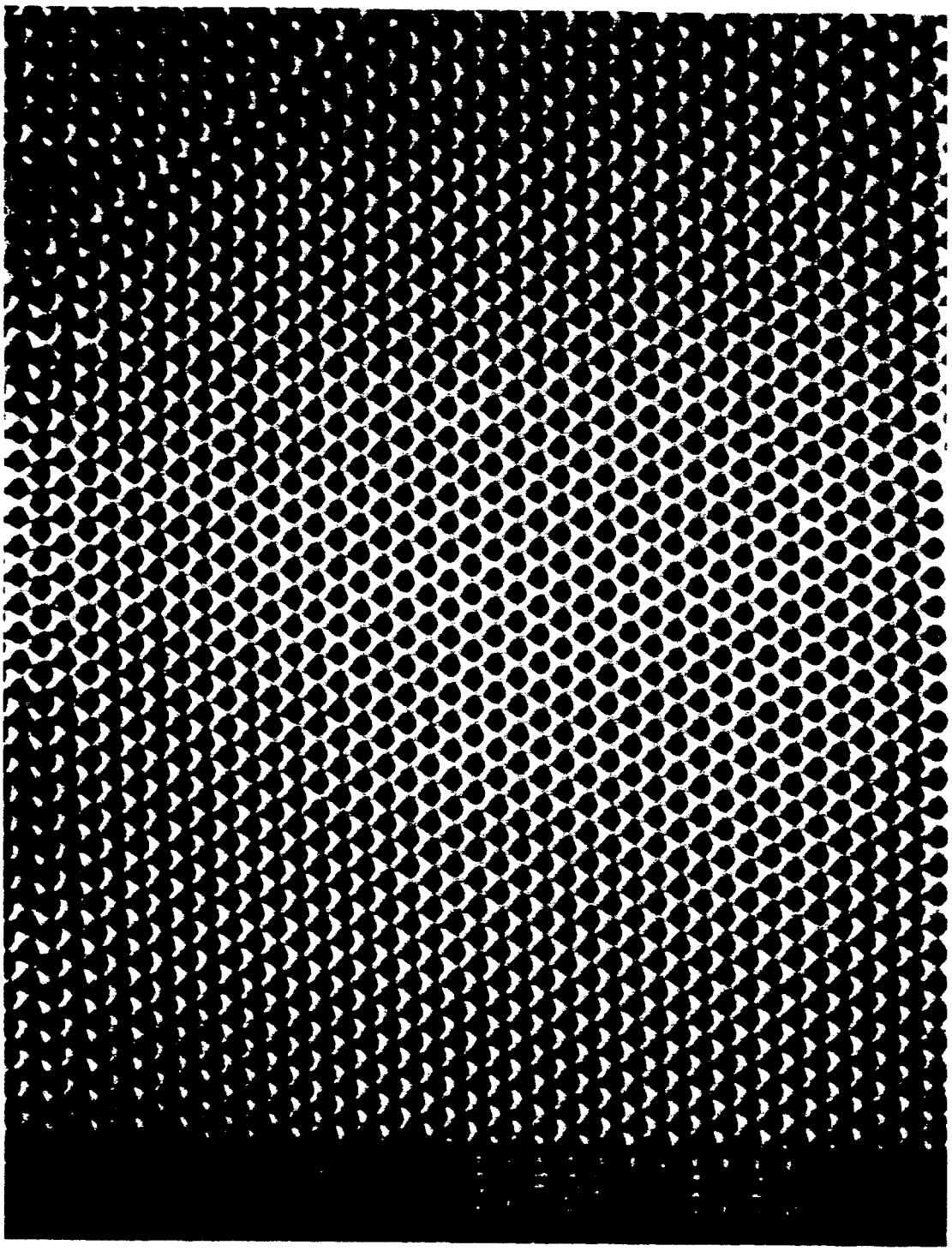
FIG. 4(a) is a scanning electron micrograph of a mask made according to the present invention having 450 nanometer channel diameters.
Figure 4B:
FIG. 4(b) is a scanning electron micrograph of a mask of the present invention having 90 nanometer channel diameters.
Figure 4C:
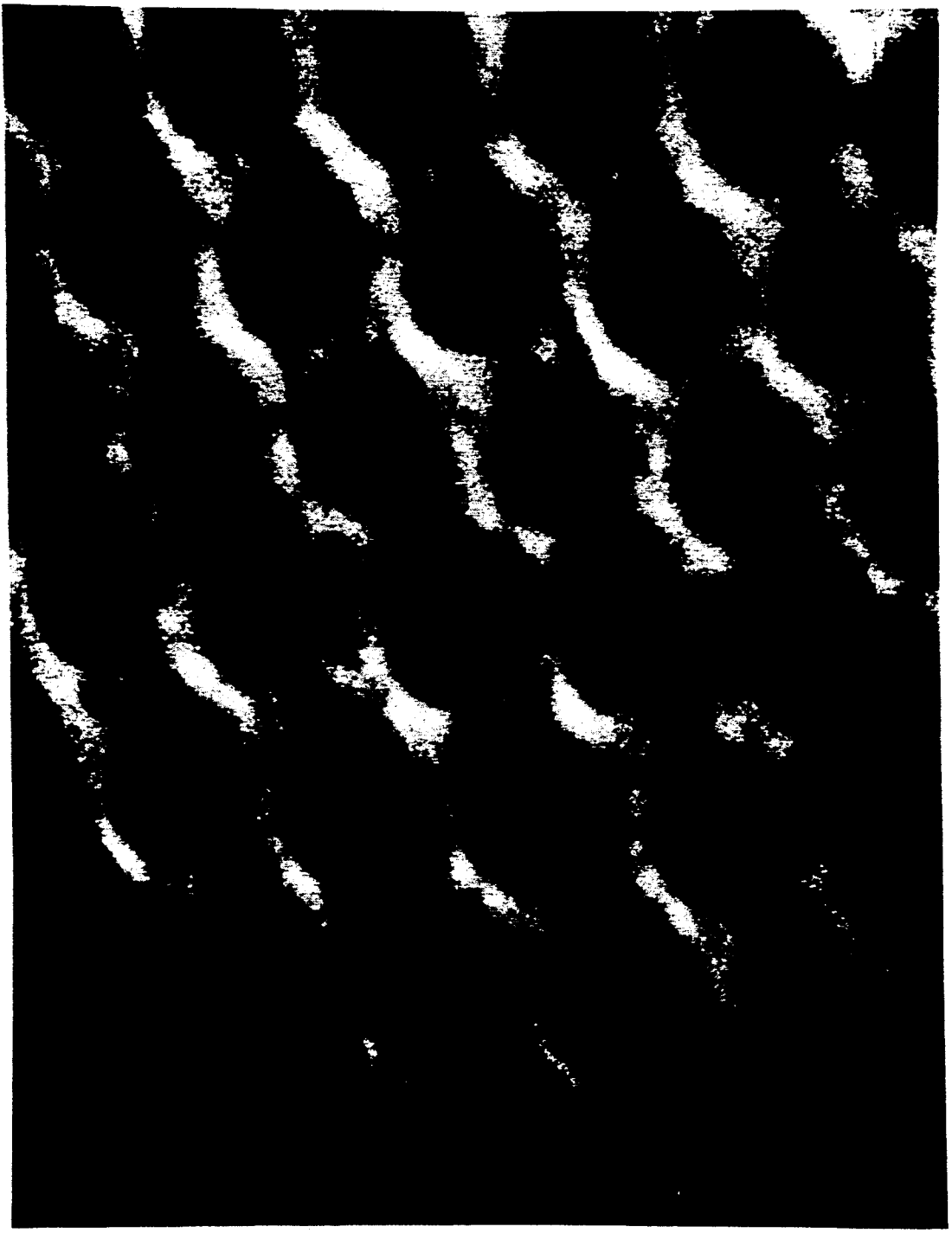
FIG. 4(c) is a scanning electron micrograph of a mask of the present invention having 40 nanometer channel diameters.

As is shown in FIG. 1, fabrication starts by insertion of a cylindrical acid etchable glass rod 2, the channel glass, into an inert hexagonal glass tube 4, the matrix glass, whose inner dimensions match that of the rod. The pair is then fused by heating the glasses close to the melting point. The pair is then drawn to reduce the overall cross-section to that of a fine filament. The filaments are then stacked, fused again and redrawn under vacuum as is shown in FIG. 2. This process is continued until appropriate channel diameters and the desired number of array elements are achieved. Annealing of the glasses is necessary if the glasses chosen are susceptible to work hardening. By adjusting the ratio of the diameter of the etchable glass rod to that of the outside dimension of the hexagonal inert glass tubing, the center to center spacing of the rods and their diameters in the finished product become independently adjustable parameters. A section of the final product is shown in FIG. 3 in which channels 6 extend through a matrix 8. FIG. 4(a) shows a scanning electron micrograph (SEM) of a hexagonal close packing (HCP) arrangement of channel glasses in relief after acid etching. The sample contains approximately $5 \times 10^6$ channels arranged in a highly regular two dimensional array. The channels are extremely uniform in size throughout the entire area of the array with a diameter of approximately 450 nanometers and the center to center spacing is approximately 750 nanometers. FIG. 4(b) shows a similar SEM micrograph with 90 nanometer channel diameters. The rough appearance of the channel boundaries and apparent cracking of the surface is due to the approximately 8 nanometer thick incomplete layer of gold deposited on the nanochannel mask surface to avoid charging effects during SEM analysis and is not indicative of the nanochannel mask itself. FIG. 4(c) shows a similar SEM micrograph with 40 nanometer channel diameters.

The fabrication process is very suitable to mass production requirements. The wafer-like nanochannel mask is generally only a few millimeters thick and is sectioned from a fused matrix bar several feet long. The fused matrix bar is cut from a longer matrix bar which continuously flows from the final drawing process. Up to 100 feet of identical fused matrix bar can be fabricated in a single run, from which more than 50,000 identical nanochannel masks can be cut. In order to produce a mask which can withstand the acid etching treatment, after the wafer-like mask has been cut from the fused stack of fibers, the mask should be annealed at an elevated temperature, preferably about 425° C. for about 2 hours in order to relieve stress in the matrix.

By adjusting the geometry of the outer wall of the tubing so that it has a square, rectangular, triangular, etc., cross-section, the packing arrangement or geometry of the array can be adjusted. Also, by adjusting the shape of the circumference of the channel glass, the channel shape can be altered. More intricate patterns can be fabricated by stacking dissimilar filaments next to each other. The fabrication process for the nanochannel mask array of the present invention yields extremely regular channels whose diameters are adjustable in size from microns to several nanometers.

In order to allow for etching of channels as small as those used in the present invention, the difference between the relative etch rates of the etchable glass to the inert glass needs to be very large. While in porous glass having larger pore sizes, the etch rate of the etchable glass is 1,000 to 10,000 times the etch rate of the inert glass, in the present invention, the etch rate of the etchable glass is preferably $10^5$ to $10^7$ the etch rate of the inert glass. Because of the microscopic size of the channels formed in the mask, it is also important that the two glasses not diffuse into each other while they are drawn. Therefore, a minimum of heat and time should be used while the glasses are being drawn. Although the exact drawing temperature is dependent on the glasses used, the drawing temperature is generally between 625 and 750° V. A preferred inert glass is Corning Glass 0120, 8161 or 0080. Corning Glass 0120 is a potash soda lead glass. Preferred etchable glasses are EG-1, EG-2 and EG-4 manufactured by Detector Technology. Using Corning Glass 0120 as the inert glass and EG-2 as the etchable glass, masks have been prepared having average channel diameters of less than 400 Å, preferably less than 100 Å.

Preferably, although acids such as nitric acid and hydrochloric acid can be used to etch the acid etchable glass, the acid used in the acid etching of the etchable glass is preferably an organic acid such as acetic acid which does not leave a residue on the acid inert glass. Preferably, the acid etching solution is at a concentration of 0.1 to 2%.

Figure 5A:
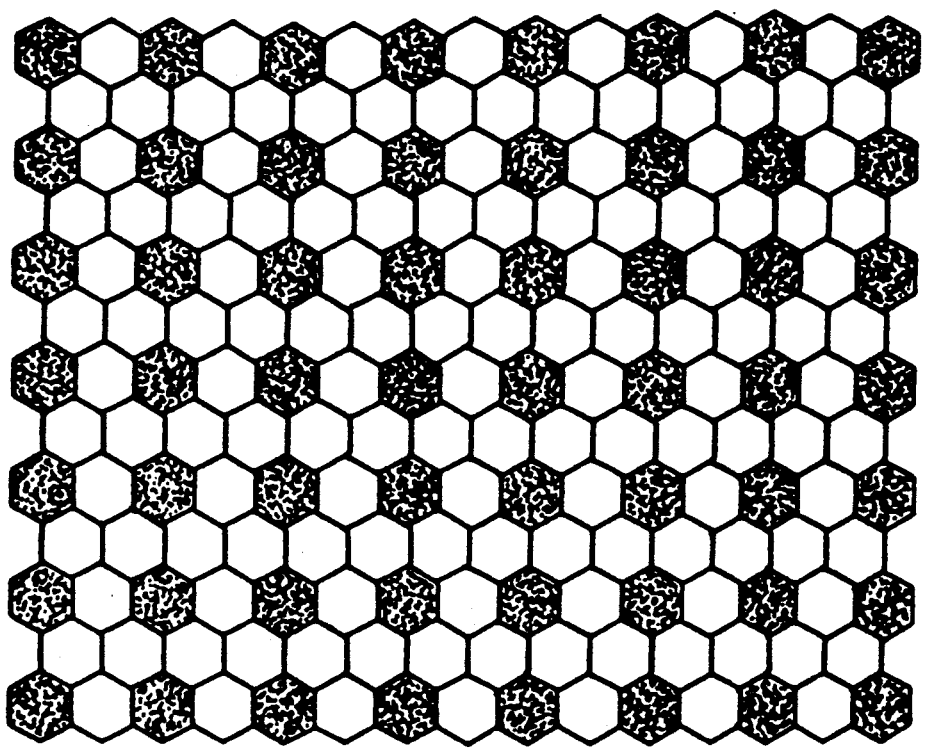
FIG. 5(a) is a top view of a nanochannel mask of solid homogeneous hexagonal rods of either acid-etchable or inert glass demonstrating a square array.
Figure 5B:
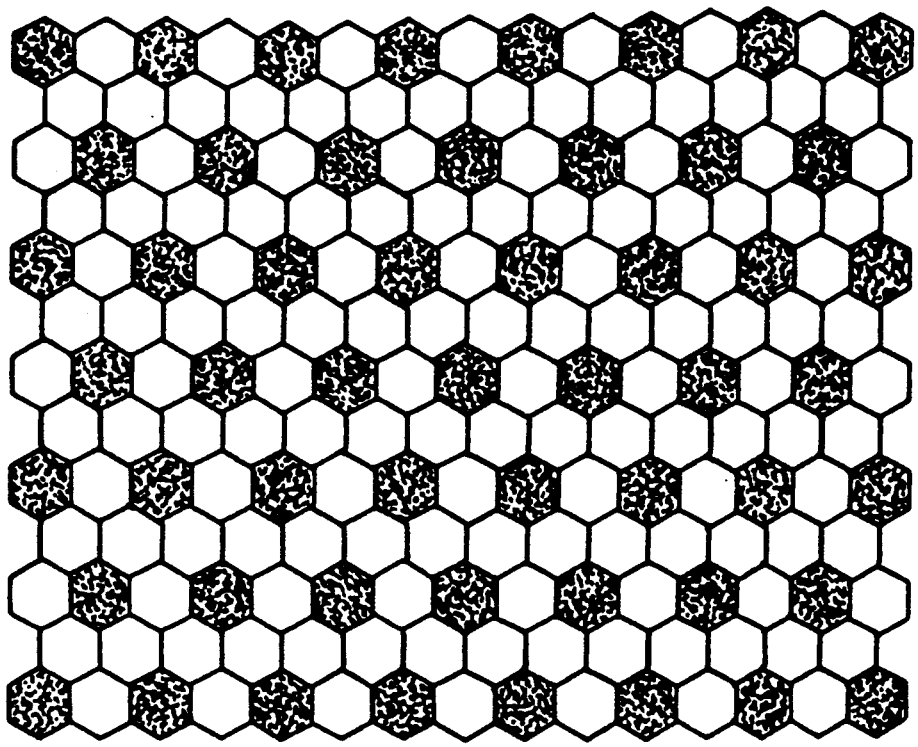
FIG. 5(b) is a top view of a nanochannel mask composed of solid homogeneous hexagonal rods of either acid-etchable or inert glass demonstrating a hexagonal array.

In another embodiment of the nanochannel mask, an array is composed of solid homogeneous hexagonal rods of either etchable or inert glass. Examples of such masks are illustrated in FIGS. 5(a) and 5(b). The dark regions are composed of acid etchable pixels or rods 10 and the light regions are composed of inert pixels or rods 12.

Figure 6A:
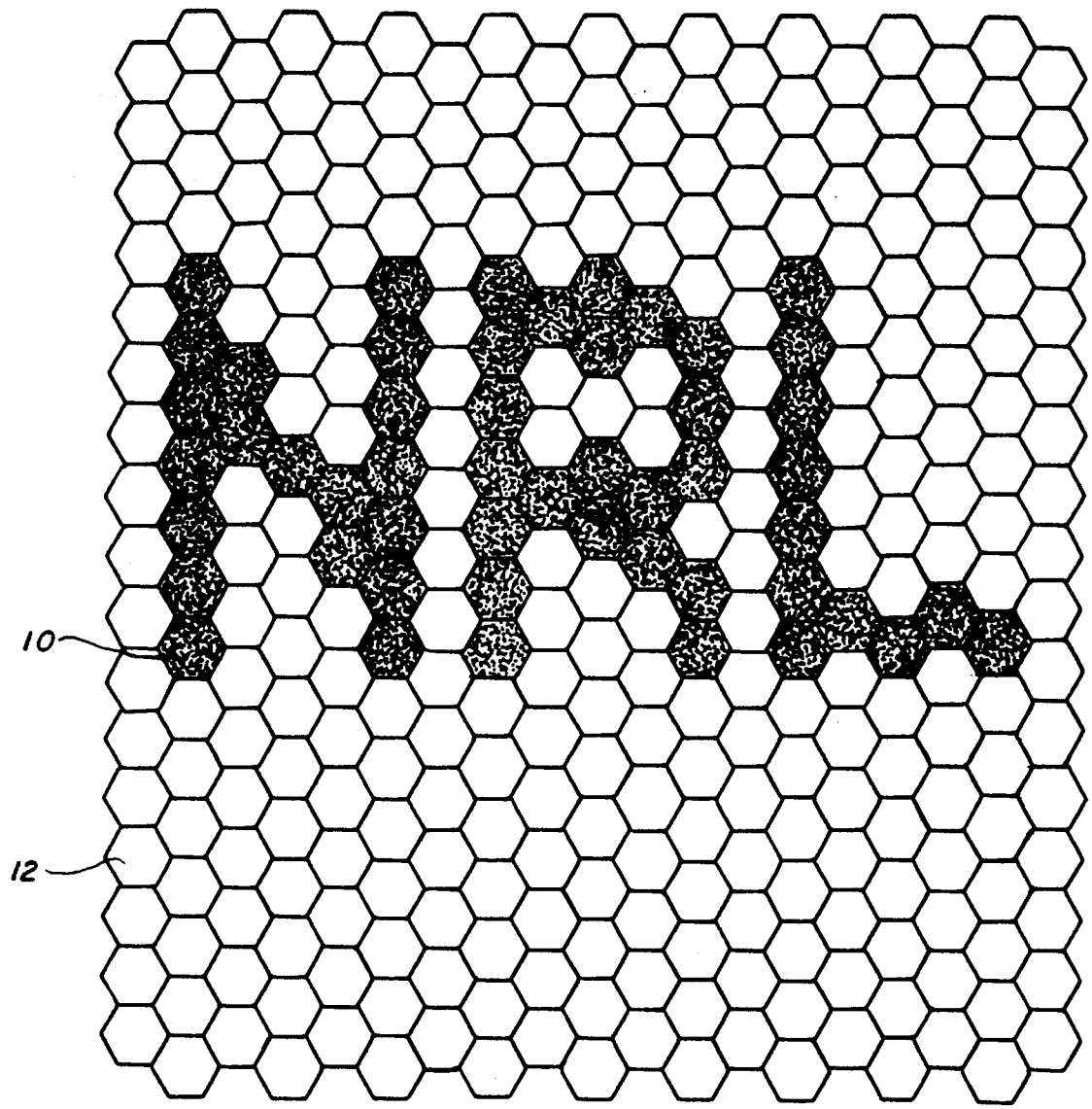
FIG. 6(a) is a top plan view of a nanochannel mask composed of solid homogeneous hexagonal rods of either etchable or inert glass demonstrating connecting structures.
Figure 6C:
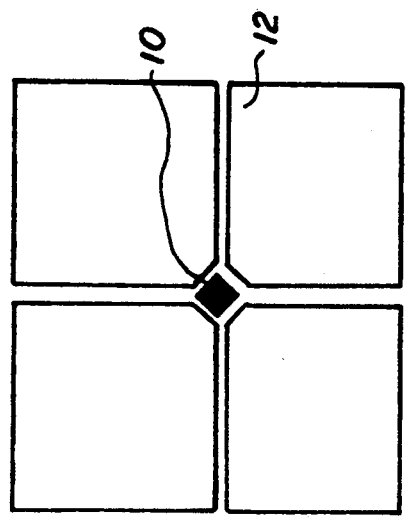
FIG. 6(c) is an alternate embodiment showing the use of solid rods of inert acid-etchable glasses in a square configuration.

An example of a mask with connecting structures is shown in FIG. 6(a). In another embodiment, fabrication of nanochannel glass includes the step of extruding D-shaped rods with small grooves along the center of the flat face, as shown on FIG. 6(b). For tighter tolerances, the groove may be cut instead of being formed by the die used in the extrusion to make the D-shaped rod. An acid-etchable glass fiber or rod drawn down to 100 microns in diameter or smaller is placed in the groove of the D-shaped rod and another D-shaped rod is attached. The rods are stacked for drawing sequences as already described. Nanometer dimensions of the channel diameters can now be accomplished in just two additional draws, minimizing the interdiffusion of the glass types. Extremely smooth, high definition channel walls can be fabricated in this fashion. The matrix glass chosen for the D-shaped rod must have a lower working temperature than the etchable fiber so the matrix can flow and close the area around the fiber during the vacuum drawing process without fiber distortion. In practice, a hexagonal rod is used since it has a closed packing geometry. As earlier, dark regions are composed of acid-etchable pixels or rods 10 and the light regions are composed of inert pixels or glass rods 12. In another embodiment, the fabrication method utilizes the radius of the corners of long glass bars with rectangular or square cross-sections. FIG. 6(c) illustrates the square embodiment with dark regions composed of acid-etchable pixels or rods 10 and light regions composed of inert pixels or glass rods 12. The edges can be ground for greater accuracy. The assembly is clamped and drawn under vacuum to produce a fine square filament. The filaments can be restacked and redrawn or combined with other materials in a predetermined complex pattern. As before, channel diameters with nanometer dimensions can be fabricated in just two draws, thus greatly reducing the time the dissimilar glasses are in contact at elevated temperatures. Any other close packing geometry of glass bars, such as triangular, hexagonal, etc., can also be used. In still another embodiment, illustrated in FIG. 6(d), nanochannel glass is fabricated using solid bars 10 of acid-etchable glass in between much larger rods 12 of inert glass.

Figure 6B:
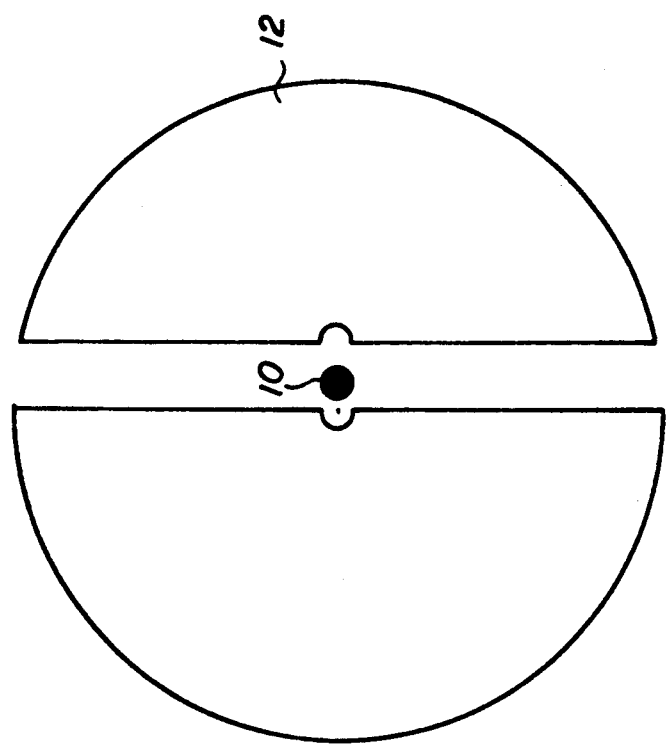
FIG. 6(b) is an alternate embodiment showing the use of solid rods of inert acid-etchable glasses in a split D configuration.

Squares, slabs and other structures can be inserted into the matrix if the physical properties (melting point viscosity at working temperatures, thermal expansion coefficient, etc.) of the inserted glass are chosen properly. Many other, more complex and intricate patterning of mask fabrication is possible. FIGS. 6(b), 6(c) and 6(d) illustrate alternative glass fabrication methods using solid rods of different shapes and sizes. Examples of how the nanochannel mask can be used for quantum confined semiconductor device fabrication are described below.

Figure 7:
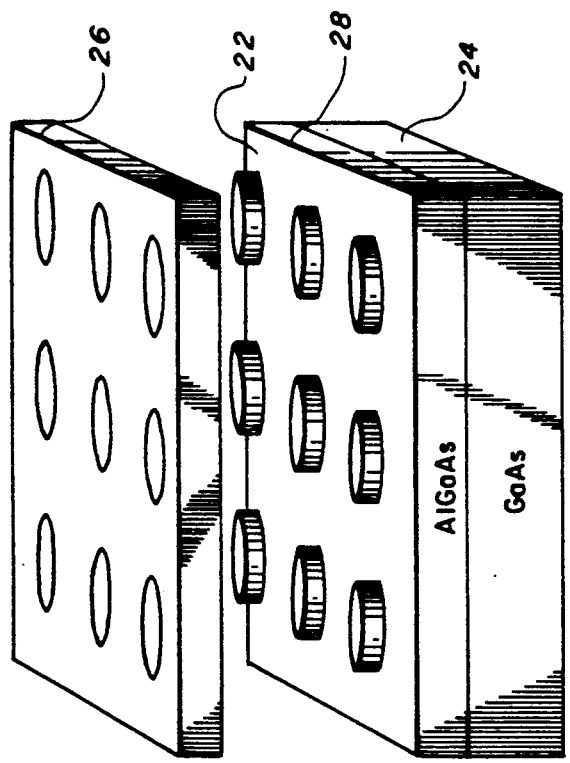
FIG. 7 illustrates a method for fabricating a semiconductor device containing quantum dots.
Figure 8:
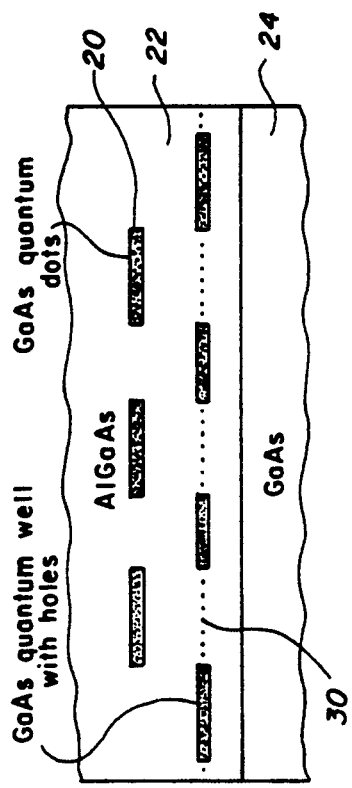
FIG. 8 is a schematic cross-section of a semiconductor device of the present invention containing a uniform array of quantum dots suspended in a lattice of matched AlGaAs deposited on a substrate of GaAs.

When the semiconductor substrate/nanochannel mask system is used in conjunction with molecular beam epitaxy (MBE) fabrication techniques, islands of semiconductor material can be patterned over the existing substrate and the mask removed for further processing. This "direct writing" method is shown in FIGS. 7 and 8 for a GaAs/AlGaAs system to fabricate a device containing a uniform array of quantum dots 20 suspended in a lattice 22 of matched AlGaAs deposited on a substrate 24 of GaAs. AlGaAs 22 is grown over a GaAs substrate 24 to act as a suitable base. A thin array nanochannel mask 26 is positioned over the AlGaAs base and additional AlGaAs (200–500 Å thick) is laid down by MBE to form an array of pedestals 28. Mask 26 is removed and a thin layer of GaAs (50–400 Å thick) is laid down forming a GaAs cap on top of each pedestal and a connected GaAs layer completely covering the base. A thick layer of AlGaAs is then deposited over the GaAs leaving an array of quantum dots 20 suspended over a quantum well structure 30 with holes punched into it. The interaction of the quantum well 30 with the quantum dot array 20 can be varied by adjusting the pedestal height (potential tunnel diode devices).

Another example of patterning a quantum dot array using the nanochannel mask for fabrication involves the deposition of a protective layer just over a quantum well structure. Again using the AlGaAs system as an example, a metal, such as aluminum, is deposited through the nanochannel mask onto the quantum well substrate. After some accumulation has occurred, the mask is removed. Aluminum is implanted into the substrate by ion implantation entering only those regions of the well not covered by the prior aluminum accumulation. The aluminum pedestals protect the lattice matched surfaces underneath them. The surface aluminum is then removed and the AlGaAs system is annealed by standard techniques, forming AlGaAs in the regions of the well previously unprotected. This produces a quantum dot array of GaAs embedded in a lattice matched host of AlGaAs. Multiple quantum wells can be used in a similar fashion to define a three dimensional array of quantum dots and a "thick" quantum well can be used to fabricate arrays of quantum wires.

Figure 10:
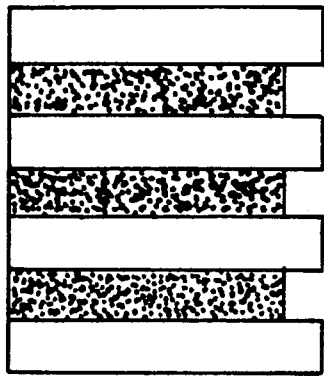
FIG. 10 is a cross sectional view of the array FIG. 9 after being partially etched.
Figure 12:
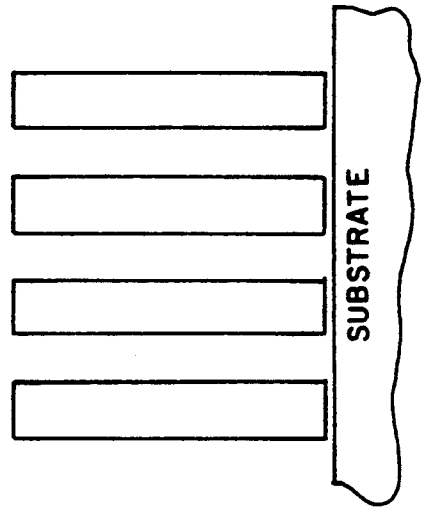
FIG. 12 is a cross sectional view of the array of FIG. 11 after glass shaded in FIG. 11 has been etched away.
Figure 9:
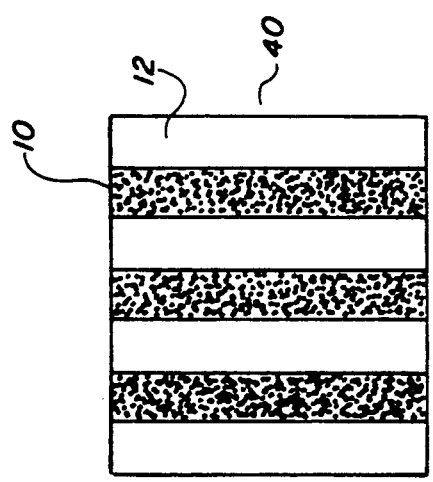
FIG. 9 is a cross sectional view of a glass array of the present invention prior to etching.
Figure 11:
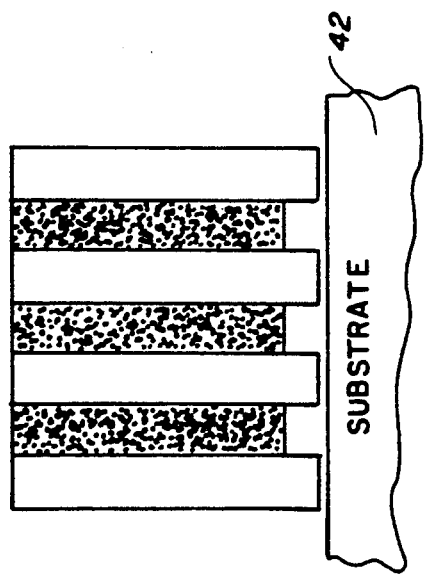
FIG. 11 is a cross sectional view of the partially etched array of FIG. 10 after being bonded to a substrate.

For extended connected linear regions or regions where the mask is required to form a closed connected geometry, such as the top part of the R shown in FIG. 6(a), a different mask fabrication process is required. In such a case, the dark regions of FIG. 6(a) are composed of acid etchable rods 10 with an etchable rate $R_1$ and the light regions composed of rods 12 with etchable rate $R_2$ where $R_1 > R_2$. As shown in FIGS. 9, 10 and 11, fabrication can be accomplished by bonding an array 40 onto a substrate 42 after a slight acid etch to the contact surface 44 of array 40. As shown in FIG. 12, further acid etching removes remaining etchable glass 10. Materials such as aluminum can then be deposited on substrate 42 as described above for other deposition processes. After deposition, glass 12 is etched away and substrate 42 is heated to remove any residual oxide layers.

The nanochannel mask of the present invention can be configured for a variety of other lithographic techniques. If the dark shaded glass 10 of FIG. 6 is composed of a glass identical to the unshaded glass 12, except that the dark shaded glass 10 is doped with a material with a high absorption or scattering cross-section for X-rays (such as lead), then a thin section of the mask can be used to define patterns optically, via x-rays, on energy sensitive surfaces. No etching of the glass is required. An inverted or negative lithographic mask can be fabricated in a similar way by applying the dopant material to the unshaded rods. Refinements include etching the dark pixels, leaving them as hollow tubes (unshaded glass doped) or filling the empty tubes with fully concentrated appropriate material to block the x-rays (unshaded glass not doped). Longer wavelength photons ($>\lambda/2$) can also be applied by an evanescent wave approach.

Figure 13:
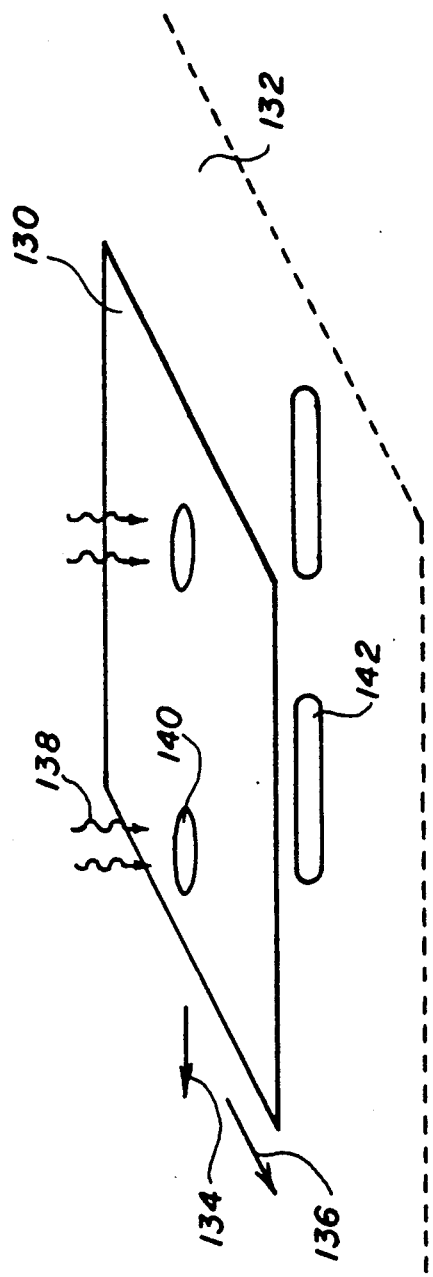
FIG. 13 illustrates the translation of a mask over a substrate allowing the massively parallel fabrication of complex nanometer scale circuits.

The nanochannel mask of the present invention can be used for large scale parallel fabrication of complex circuits by translating the mask over a substrate while deposition of a source through the mask is occuring. FIG. 13 shows the translation of the mask 130 relative to substrate 132. Arrow 134 indicates translation or movement in the X plane whereas arrow 136 indicates mask translation in the Y plane. Source 138, which can be in the form material or energy, passes through nanochannels 140 in mask 130 to expose resist 142, deposit material, or to effect another reaction on substrate 132. By translating the mask in the X and/or Y planes, it is possible to fabricate complex circuits and various geometric shapes, using the invention described herein.

Low energy electrons or ions can also be used to define patterns on energy sensitive surfaces with the nanochannel mask. Very thin masks with empty channels can be fabricated by the dual etching process (with etchable rates $R_1$ and $R_2$) described above and used in conjunction with collimated beams of low energy ions or electrons. An electrically conductive glass can be chosen to pull away excess charge during processing. With broad spatial beam profiles, the entire pattern may be fabricated at once. The low energy mode of operation greatly reduces substrate damage and back scattering, greatly increasing pattern contrast and definition.

The nanochannel mask used in the method of the present invention combines the ease of simultaneous large scale ($>10^7$ elements) patterning of nanometer sized elements with the accuracy and precision of ion and electron beam direct writing, without the usual substrate damage associated with these techniques. The high temperature stability of the nanochannel mask makes nanometer scale lithography viable in molecular beam epitaxy (MBE) type applications for the first time. Fabrication of a new class of materials and devices that rely on both the shift in energy due to quantum confinement and cooperative effects between quantum confined elements in large arrays can now be realized. These include quantum enhanced laser materials of bulk proportions with adjustable output frequencies dependent upon the degree of confinement, ultra small (quantum) electronic devices, far infrared filters (derived from cooperative effects) and nonlinear optoelectronic devices to name a few. The most unique properties of the nanochannel mask are: the high temperature stability of the glass, the very small size of the channels and the accuracy and precision to which these small channels can be arranged to form very large and complex mask structures. Regular arrays can be fabricated with extremely good geometric uniformity and very low variance in channel dimensions. Channel packing densities can approach $10^{12}/cm^2$ and channel diameters can be made under 10 nanometers (100 Å) with great precision. The fabrication process allows complex formations to be repeated many times within the mask which is important in memory and logic circuits. In addition, up to 50,000 identical thin masks can be produced in a single run. This makes the nanochannel mask and its fabrication process well suited to industrial mass production techniques. In general, a variety of devices can be fabricated using the nanochannel mask which are unique or surpass existing devices in their functions and performance.

For purposes herein, glass is a noncrystalline substance formed usually by the fusion of the constituent materials by melting followed by cooling to yield a supercooled solution which most closely resembles a rigid liquid. Electronic strucktures noted herein, such as masks, have thickness on the order of up to millimeter whereas wafer-like masks should be as thin as possible up to a few nanometers, preferably about 1 to 50 nanometers. Masks for ion implantation, should be about 1 to 20 microns. Masks for particle deposition should be as thin as possible preferably on the order of a few tens of nanometers, especially on the order of a few nanometers.

The formation of the nanochannel glass mask will now be described by way of the following examples.

EXAMPLE I

The inert glass used was a hexagonal tube of Corning Glass 0120 glass. The etchable glass used was Detector Technology's EG-2. The glasses were fused under vacuum during the drawing process at a temperature of 625° to 750° C. and were drawn down to fine filaments of 0.01 to 0.2 inches (0.03 to 0.5 cm) and cut to lengths of 1 to 3 feet (30 to 90 cm). The filaments were stacked into bundles, approximately 1.5 inches flat to flat, drawn and restacked and redrawn until the desired channel diameter was achieved. Just before the final draw, a cladding was added for strength and to facilitate handling by placing the bundle inside a hollow tube (usually Corning 0120 glass) and drawing under vacuum. To relieve the stress, the glass composition was annealed after each draw. The glass was then cut to the desired length, polished and etched in a weak acid such as 1% HCL, $HNo_3$ or acetic acid to remove the channel glass and leave behind the porous matrix glass and cladding.

EXAMPLE II

Hexagonal monofilaments of Corning 0120 glass and Detector Technology's EG-2 were used as the inert glass and etchable glass filaments, respectively. The monofilaments, typically 0.01 to 0.1 inches (0.025 to 0.25 cm) in width were stacked in predetermined pattern which can be used to make arrays. After the monofilaments are stacked, the process is essentially the same as described in example I. An advantage to using this technique is that one less draw is required in which the dissimilar filaments are in contact with each other at elevated temperatures, greatly reducing the diffusion of glasses into one another and yielding a stronger matrix as well as finer resolution, especially at glass dimensions around 10 nanometers. Another advantage is that individual pixel replacement is possible with a variety of glass types making very complex structures possible.

What is claimed is:

1. A method for depositing a pattern of deposited material on or within a substrate, comprising the steps of:
   interposing a glass mask between a source and a substrate, the mask having channels therethrough which are arranged in a pattern which have an average diameter of less than about 400 Å; and
   depositing a material selected from the group of sources consisting of ions, electrons, photons, metals and semiconductor materials through the glass masks into or onto the substrate.

2. A method for forming a semiconductor device, comprising the steps of:
   growing a first layer of first semiconductor material over a second semiconductor material substrate to form a base;
   interposing a glass mask between the base and a source of the first semiconductor material, the masks having channels therethrough which are arranged in a pattern which have an average diameter of less than 1 micron;
   depositing additional first semiconductor material through the glass mask and onto the base to form an array of pedestals;
   removing the mask;
   depositing a second layer of the second semiconductor material to form a cap on top of each pedestal and to form a connected layer of the second semiconductor material completely covering the base; and
   depositing a layer of the first semiconductor material over the second layer of the second semiconductor material to form an array of quantum dots suspended over a quantum well structure having holes therein.

3. A method for forming a semiconductor device according to claim 2, wherein he first smeiconductor material comprises AlGaAs and the second material comprises GaAs.

4. A method for forming a semiconductor device comprising the steps of:
   interposing a glass mask between a semiconductor material substrate and a source of a metal dopant, the mask having channels therethrough which are arranged in a pattern and which have a average diameter of less than 1 micron;
   depositing the dopant through the mask and onto the substrate of semiconductor material;
   removing the mask;
   ion implanting additional dopant into the substrate;
   removing dopant on the surface of the substrate; and
   annealing the doped substrate to form a semiconductor device.

5. A method according to claim 4, wherein the metal dopant is aluminum and the substrate comprises heterostructures.

6. A method of forming a semiconductor device comprising the steps of:
   forming a glass block of an acid inert glass having acid etchable glass rods extending therethrough, the acid etchable glass rods having a diameter of less than 1 micron, the acid inert glass having a lower melting point than the acid etchable glass;
   partially etching the acid etchable rods so that an exposed surface of the acid inert glass block extends above the ends of the acid etchable rods;
   bonding the exposed ends of the acid inert glass block to a substrate;
   etching away the acid etchable rods from the acid inert glass to form a mask on the substrate; and
   depositing a coating selected from the group consisting of metals and semiconductor materials through the glass block onto the substrate to form a semiconductor device.

* * * * *